United States Patent
Huang et al.

(10) Patent No.: US 11,688,825 B2
(45) Date of Patent: Jun. 27, 2023

(54) COMPOSITE SUBSTRATE AND LIGHT-EMITTING DIODE

(71) Applicants: Industrial Technology Research Institute, Hsinchu (TW); OPTO TECH CORP., Hsinchu (TW)

(72) Inventors: Chia-Yen Huang, Taipei (TW); Chang Da Tsai, Hsinchu (TW)

(73) Assignees: Industrial Technology Research Institute, Hsinchu (TW); OPTO TECH CORP., Hsinchu (TW)

( * ) Notice: Subject to any disclaimer, the term of this patent is extended or adjusted under 35 U.S.C. 154(b) by 366 days.

(21) Appl. No.: 17/006,891

(22) Filed: Aug. 31, 2020

(65) Prior Publication Data

US 2021/0005778 A1 Jan. 7, 2021

Related U.S. Application Data

(63) Continuation-in-part of application No. 16/745,292, filed on Jan. 16, 2020, now Pat. No. 11,220,743.
(Continued)

(30) Foreign Application Priority Data

Aug. 30, 2019 (TW) .................................. 108131160

(51) Int. Cl.
*H01L 33/00* (2010.01)
*H01L 33/12* (2010.01)
(Continued)

(52) U.S. Cl.
CPC ........ *H01L 33/0095* (2013.01); *H01L 33/025* (2013.01); *H01L 33/12* (2013.01);
(Continued)

(58) Field of Classification Search
CPC ... H01L 33/0095; H01L 33/025; H01L 33/12; H01L 33/007; H01L 33/04; H01L 33/06; H01L 33/325; H01L 33/42; H01L 33/32
See application file for complete search history.

(56) References Cited

U.S. PATENT DOCUMENTS 7,812,366 B1    10/2010  Sampath et al.
9,153,645 B2 *  10/2015  Li .................... H01L 29/1054
(Continued)

FOREIGN PATENT DOCUMENTS

CN    103035804    4/2013
CN    103700579    4/2014
(Continued)

OTHER PUBLICATIONS

"Office Action of China Related Application No. 201910961971.5", dated Jun. 18, 2021, pp. 1-7.
(Continued)

*Primary Examiner* — Nathan L Van Sell
(74) *Attorney, Agent, or Firm* — JCIPRNET

(57) ABSTRACT

A composite substrate including a substrate, a buffer layer, and a strain release layer. The buffer layer is disposed on the substrate is provided. The strain release layer is disposed on the buffer layer, wherein the buffer layer is between the substrate and the strain release layer. A material of the strain release layer includes $Al_{1-x}Ga_xN$, where $0 \le x < 0.15$. The strain release layer is doped with silicon to release a compressive strain due to the buffer layer. A concentration of silicon doped in the strain release layer is greater than $10^{19}$ $cm^{-3}$. A defect density of the strain release layer is less than or equal to $5 \times 10^9/cm^2$. A light-emitting diode is also provided.

20 Claims, 14 Drawing Sheets

Related U.S. Application Data

(60) Provisional application No. 62/799,717, filed on Jan. 31, 2019.

(51) Int. Cl.
  *H01L 33/02* (2010.01)
  *H01L 33/04* (2010.01)
  *H01L 33/06* (2010.01)
  *H01L 33/32* (2010.01)

(52) U.S. Cl.
  CPC ............ *H01L 33/007* (2013.01); *H01L 33/04* (2013.01); *H01L 33/06* (2013.01); *H01L 33/325* (2013.01)

(56) References Cited

U.S. PATENT DOCUMENTS

| | | | |
|---|---|---|---|
| 2003/0213964 A1* | 11/2003 | Flynn | C30B 25/00 257/85 |
| 2007/0259534 A1 | 11/2007 | Reid et al. | |
| 2008/0217645 A1* | 9/2008 | Saxler | H01L 21/02658 257/101 |
| 2008/0220555 A1* | 9/2008 | Saxler | H01L 21/0251 438/46 |
| 2012/0076968 A1 | 3/2012 | Dmitriev et al. | |
| 2013/0009130 A1* | 1/2013 | Chen | H01L 33/32 257/15 |
| 2013/0214281 A1 | 8/2013 | Li et al. | |
| 2013/0277699 A1* | 10/2013 | Liao | H01L 33/58 257/98 |
| 2015/0076505 A1* | 3/2015 | Ke | H01L 33/005 438/29 |
| 2016/0149074 A1* | 5/2016 | Atanackovic | H01L 33/14 438/45 |
| 2017/0345642 A1* | 11/2017 | Jorgenson | H01L 21/0254 |
| 2018/0047557 A1 | 2/2018 | Odnoblyudov et al. | |
| 2020/0235260 A1 | 7/2020 | Watanabe | |
| 2021/0104504 A1* | 4/2021 | Yonkee | H01L 33/387 |

FOREIGN PATENT DOCUMENTS

| | | |
|---|---|---|
| CN | 103824919 | 5/2014 |
| CN | 105390375 | 3/2016 |
| CN | 106233429 | 12/2016 |
| CN | 107910415 | 4/2018 |
| CN | 108269887 | 7/2018 |
| TW | I557936 | 11/2016 |
| TW | 201931621 | 8/2019 |
| TW | 202030777 | 8/2020 |

OTHER PUBLICATIONS

Hideto Miyake, et al., "Preparation of high-quality AlN on sapphire by high-temperature face-to-face annealing," Journal of Crystal Growth, vol. 456, Aug. 2016, pp. 155-159.
Ryo Yoshizawa, et al., "Effect of thermal annealing on AlN films grown on sputtered AlN templates by metalorganic vapor phase epitaxy," Japanese Journal of Applied Physics, vol. 57, Jan. 2018, pp. 1-5.
Chia-Yen Huang, et al., "High-quality and highly-transparent AlN template on annealed sputter-deposited AlN buffer layer for deep ultra-violet light-emitting diodes," AIP Advances, vol. 7, May 2017, pp. 1-7.
Sebastian Walde, et al., "Impact of intermediate high temperature annealing on the properties of AlN/sapphire templates grown by metalorganic vapor phase epitaxy," Japanese Journal of Applied Physics, vol. 58, Apr. 2019, pp. 1-6.
M. X. Wang, et al., "High-temperature annealing induced evolution of strain in AlN epitaxial films grown on sapphire substrates," Applied Physics Letters, vol. 114, Mar. 2019, pp. 1-6.
Ruxue Ni, et al., "AlGaN-based ultraviolet light-emitting diode on high-temperature annealed sputtered AlN template," Journal of Alloys and Compounds, vol. 794, Apr. 2019, pp. 8-12.
Hirayama, Hideki, et al., "231-261nm AlGaN deep-ultraviolet light-emitting diodes fabricated on AlN multilayer buffers grown by ammonia pulse-flow method on sapphire," Applied Physics Letters, vol. 91, Jul. 2007, pp. 1-4.
"Office Action of Taiwan Counterpart Application", dated Jan. 28, 2021, p. 1-p. 9.

* cited by examiner

COMPOSITE SUBSTRATE AND LIGHT-EMITTING DIODE

CROSS-REFERENCE TO RELATED APPLICATION

This application is a continuation-in-part (CIP) application of and claims the priority benefit of U.S. application Ser. No. 16/745,292, filed on Jan. 16, 2020, now pending, which claims the priority benefits of U.S. provisional application Ser. No. 62/799,717, filed on Jan. 31, 2019, and Taiwan application serial no. 108131160, filed on Aug. 30, 2019. The entirety of each of the above-mentioned patent applications is hereby incorporated by reference herein and made a part of this specification.

TECHNICAL FIELD

The technical field relates to a composite substrate and a light-emitting diode (LED).

BACKGROUND

In an epitaxy manufacturing process of a light-emitting diode, if a semiconductor layer such as an N-type or P-type III-V semiconductor layer or a quantum well layer is to be grown on a substrate, it is necessary to solve a problem that the substrate (such as a sapphire substrate) and the semiconductor layer are different in a lattice constant. The lattice constant difference will lead to an epitaxy defect, and then affect a luminous efficiency of the light-emitting diode. In order to solve the foregoing problem of the lattice constant difference, a buffer layer with a small lattice constant difference is generally formed generally before the growth of the semiconductor layer.

On the other hand, in order to improve a quantum efficiency of the light-emitting diode, a patterned sapphire substrate (PSS) is developed, so as to increase a light extraction rate by means of light scattering of a protruding pattern on the substrate. At this time, if an aluminum nitride layer is used as the buffer layer, high activity and low surface mobility of aluminum atoms will lead to problems such as high dislocation density, high sewing thickness, rough surface or cracking of the aluminum nitride layer.

SUMMARY

One embodiment of the disclosure provides a composite substrate, including a substrate and an aluminum nitride layer. The aluminum nitride layer is disposed on a top surface of the substrate. Silicon is doped in the aluminum nitride layer to regulate residual stress, a film thickness of the aluminum nitride layer is less than 3.5 µm, a defect density of the aluminum nitride layer is less than or equal to $5 \times 10^9/cm^2$, and a root mean square roughness of the top surface, facing away from the substrate, of the aluminum nitride layer is less than 3 nm.

One embodiment of the disclosure provides a manufacturing method of a composite substrate, including: preparing a substrate and forming an aluminum nitride layer on a top surface of the substrate. Silicon is doped in the aluminum nitride layer to regulate residual stress, a film thickness of the aluminum nitride layer is less than 3.5 µm, a defect density of the aluminum nitride layer is less than or equal to $5 \times 10^9/cm^2$, and a root mean square roughness of the top surface, facing away from the substrate, of the aluminum nitride layer is less than 3 nm.

One embodiment of the disclosure provides a composite substrate including a substrate, a buffer layer, and a strain release layer. The buffer layer is disposed on the substrate. The strain release layer is disposed on the buffer layer, wherein the buffer layer is between the substrate and the strain release layer. A material of the strain release layer includes $Al_{1-x}Ga_xN$, where $0 \leq x < 0.15$. The strain release layer is doped with silicon to release a compressive strain due to the buffer layer. A concentration of silicon doped in the strain release layer is greater than $10^{19}$ $cm^{-3}$. A defect density of the strain release layer is less than or equal to $5 \times 10^9/cm^2$.

One embodiment of the disclosure provides a light-emitting diode (LED) including a substrate, a buffer layer, a strain release layer, an n-type semiconductor layer, a light-emitting layer, a p-type semiconductor layer, and an electrode contacting layer. The buffer layer is disposed on the substrate. The strain release layer is disposed on the buffer layer, wherein the buffer layer is between the substrate and the strain release layer. A material of the strain release layer includes $Al_{1-x}Ga_xN$, where $0 \leq x < 0.15$. The strain release layer is doped with silicon to release a compressive strain due to the buffer layer. A concentration of silicon doped in the strain release layer is greater than $10^{19}$ $cm^{-3}$. A defect density of the strain release layer is less than or equal to $5 \times 10^9/cm^2$. The n-type semiconductor layer is disposed on the strain release layer. A material of the n-type semiconductor layer includes $Al_{1-z}Ga_zN$, where $z > x + 0.15$. The light-emitting layer is disposed on the n-type semiconductor layer. The p-type semiconductor layer is disposed on the light-emitting layer. The electrode contacting layer is disposed on the p-type semiconductor layer.

Several exemplary embodiments accompanied with figures are described in detail below to further describe the disclosure in details.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

DETAILED DESCRIPTION OF DISCLOSED EMBODIMENTS

Figure 1A:
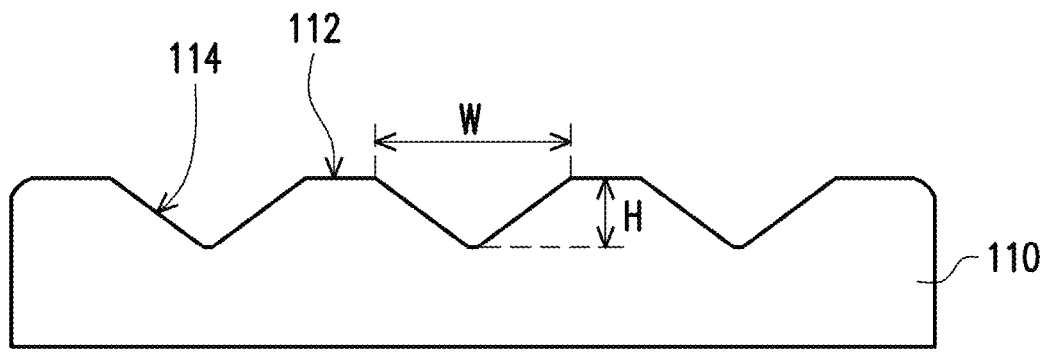
FIG. 1A and FIGS. 2 to 5 are cross-sectional diagrams of a manufacturing flow of a composite substrate according to one embodiment of the disclosure.
Figure 1B:
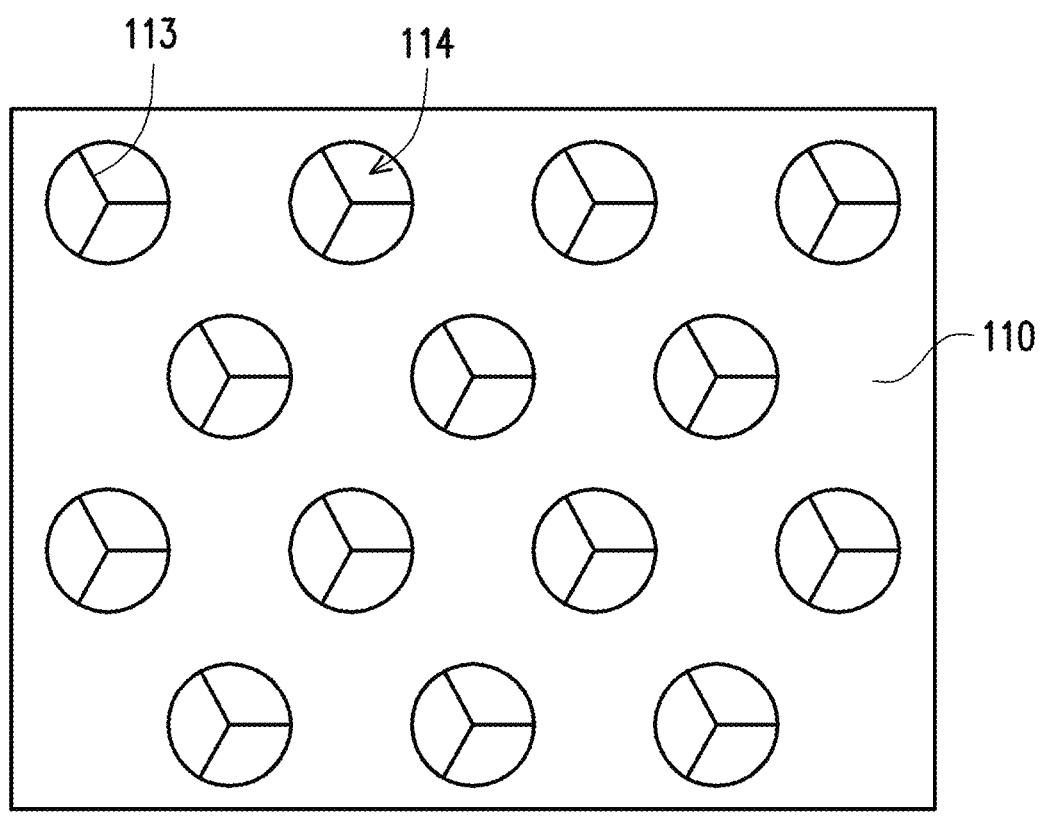
FIG. 1B is a top view of the substrate in FIG. 1A.

FIG. 1A and FIGS. 2 to 5 are cross-sectional diagrams of a manufacturing flow of a composite substrate according to one embodiment of the disclosure, and FIG. 1B is a top view of the substrate in FIG. 1A. A manufacturing method of a composite substrate of the present embodiment includes the following steps. Firstly, referring to FIGS. 1A and 1B, a substrate 110 is prepared. A top surface 112 of the substrate 110 includes a plurality of nano-patterned recesses 114, and these nano-patterned recesses 114 are separated from each other. In the present embodiment, the substrate 110 is, for example, a sapphire substrate, and a depth H of the nano-patterned recesses 114 is in a range of 150 nm to 1.5 μm, preferably 100 nm to 1 μm, more preferably 200 nm to 500 nm. Furthermore, a width W of these nano-patterned recesses is in a range of 200 nm to 1.5 μm, preferably 300 nm to 800 nm, more preferably 400 nm to 600 nm. In the present embodiment, the method for forming the nano-patterned recesses 114 is, for example, to manufacture these nano-patterned recesses 114 by performing wet etching on the top surface of the unprocessed sapphire substrate, so that etching liquid may etch the sapphire substrate along a plurality of different crystal faces, and boundary lines 113 for the crystal faces are produced between adjacent crystal faces. In the present embodiment, the plurality of crystal faces of the nano-patterned recesses 114 form an inverted pyramid shape (for example, three crystal faces form an inverted triangular pyramid shape), and the plurality (at least three, the present embodiment takes three boundary lines as an example) of boundary lines 113 are converged at a bottommost vertex of the inverted pyramid shape. In the present embodiment, side walls of the nano-patterned recesses 114 are of an inverted pyramid shape, and bottoms of the nano-patterned recesses 114 are of a tip shape. However, in other embodiments, the method for forming the nano-patterned recesses 114 may be dry etching, and the nano-patterned recesses 114 formed by this method do not have the foregoing boundary lines 113.

In the present embodiment, these nano-patterned recesses 114 are regularly arranged on the top surface 112 of the substrate 110. However, in other embodiments, these nano-patterned recesses 114 may also be arranged irregularly.

Figure 2:
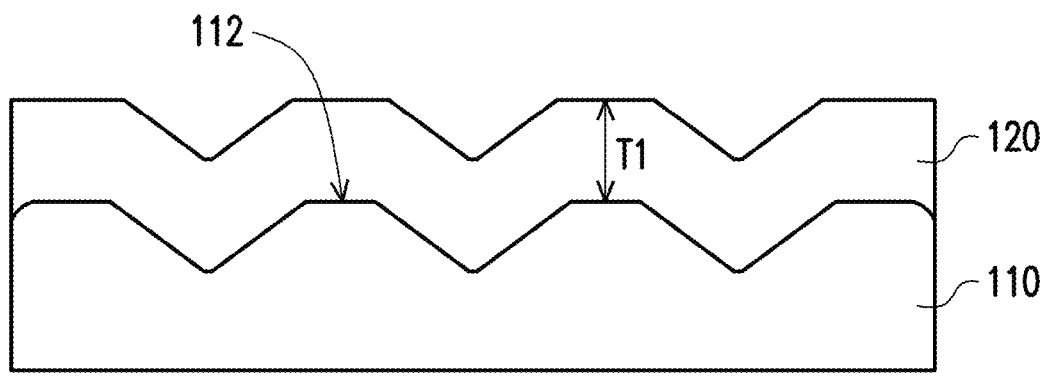

Next, referring to FIG. 2, a first aluminum nitride layer 120 is formed on the top surface 112 of the substrate 110. The method for forming the first aluminum nitride layer 120 may be metal organic chemical vapor deposition (MOCVD), sputtering, or hydride vapor phase epitaxy (HVPE). In the present embodiment, a film thickness T1 of the first aluminum nitride layer 120 is greater than the depth H of the nano-patterned recesses 114.

Figure 3:
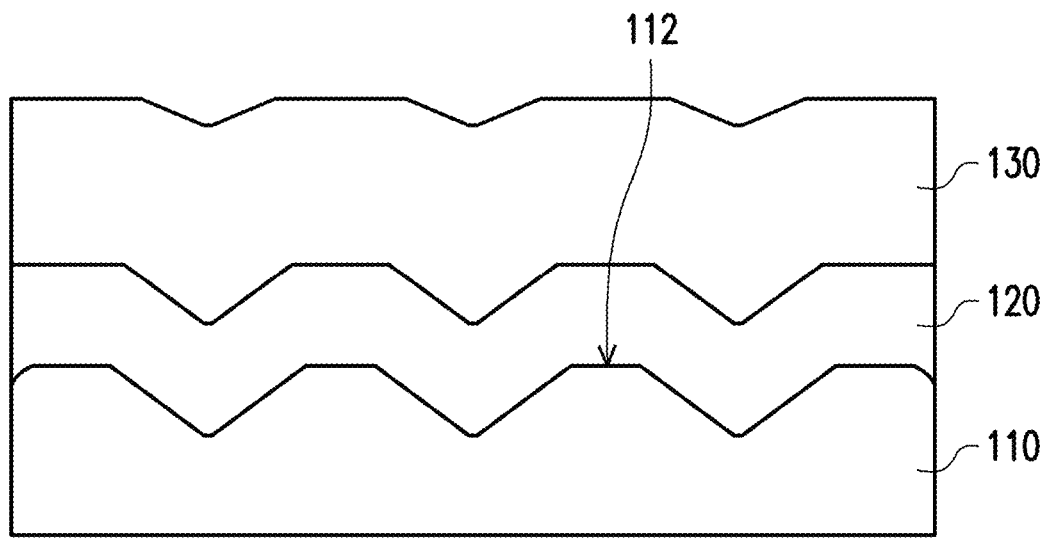

Then, referring to FIG. 3, a planarization layer 130 is formed on the first aluminum nitride layer 120. After the planarization layer 130 covers the first aluminum nitride layer 120, a top surface of the planarization layer 130 is flatter than a top surface of the first aluminum nitride layer 120. In the present embodiment, a material of the planarization layer 130 is, for example, spin-on glass. However, in other embodiments, the material of the planarization layer 130 may also be a polymer.

Figure 4:
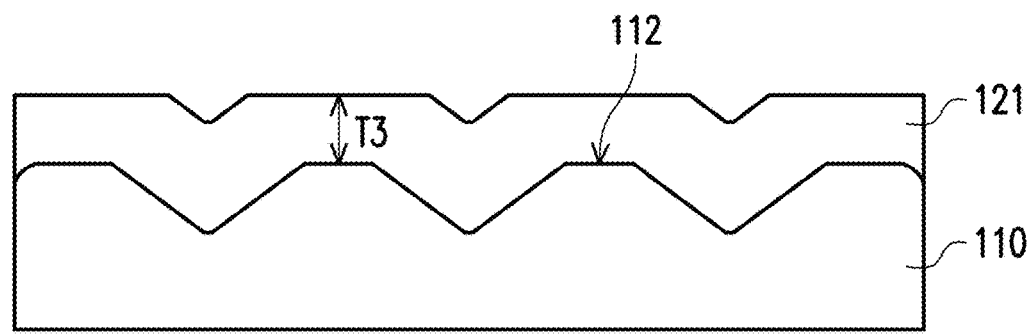

Thereafter, referring to FIG. 4, the material of the planarization layer 130 is gradually removed. When the material of the planarization layer 130 is gradually removed to a bottom of the planarization layer 130, part of the first aluminum nitride layer 120 may also be gradually removed to flatten the first aluminum nitride layer 120 and form a first aluminum nitride layer 121 having a relatively flat top surface. In the present embodiment, the method for gradually removing the material of the planarization layer 130 is dry etching, such as an inductively coupled plasma (ICP) etching method, and etching conditions may be selected to make the etching rate of planarization layer 130 substantially the same as the etching rate of the first aluminum nitride layer 121. In this way, when all the materials of the planarization layer 130 are etched away, part of the first aluminum nitride layer 120 will be etched at this time to enable the appearance of the top surface of the planarization layer 130 to be transferred to the top surface of the first aluminum nitride layer 121 to form the relatively flat first aluminum nitride layer 121. However, in other embodiments, the method for gradually removing the material of the planarization layer 130 may also be mechanical polishing.

In addition, after the material of the planarization layer 130 is gradually removed, annealing, such as high-temperature annealing at 1,500° C. or above, may be performed on the flattened first aluminum nitride layer 121. The high-temperature annealing can lead to recrystallization of the first aluminum nitride layer 121 and greatly reduce a dislocation density in a film of the first aluminum nitride layer 121.

Figure 5:
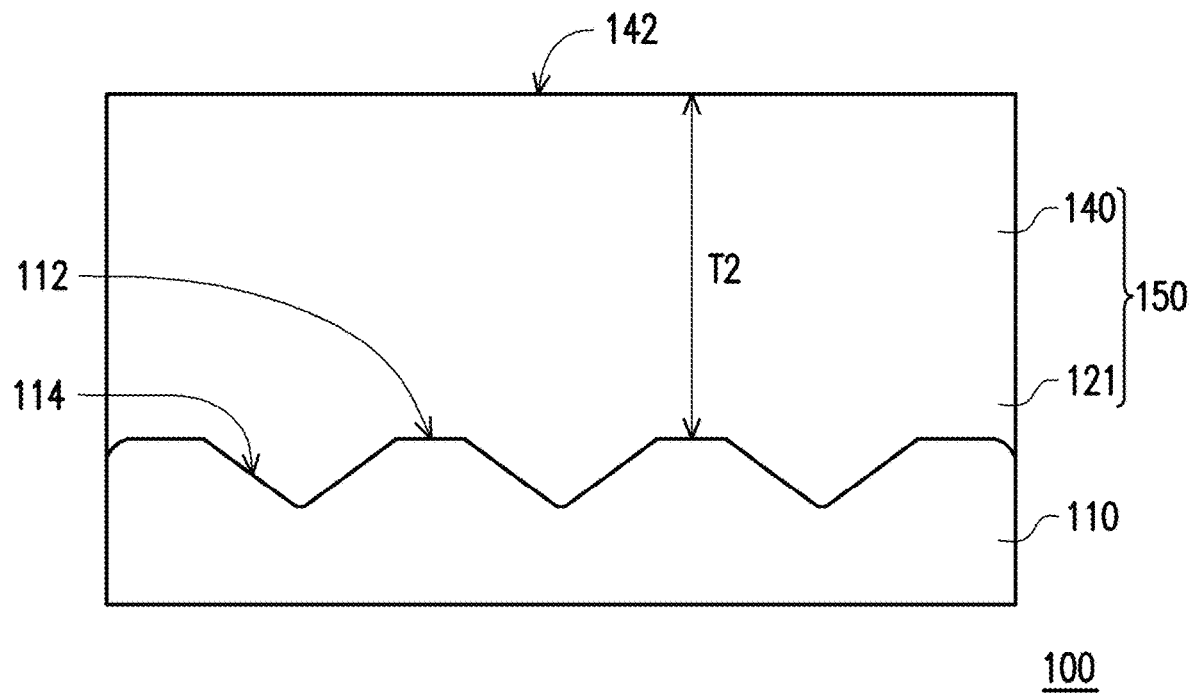

Thereafter, referring to FIG. 5, a second aluminum nitride layer 140 is formed on the flattened first aluminum nitride layer 121. For example, the second aluminum nitride layer 140 is formed by the MOCVD. Since the second aluminum nitride layer 140 is formed on the flattened first aluminum nitride layer 121, a root mean square roughness of a top surface 142, facing away from the substrate 110, of the second aluminum nitride layer 140 is less than 3 nm. Since the second aluminum nitride layer 140 is formed on the first aluminum nitride layer 121 having the relatively flat top surface, a sewing thickness of the second aluminum nitride layer 140 can be relatively small. In the present embodiment, a film thickness T2 of an aluminum nitride layer 150 formed by the first aluminum nitride layer 121 and the second aluminum nitride layer 140 is less than 3.5 μm. In addition, since the second aluminum nitride layer 140 is formed on the first aluminum nitride layer 121 having the relatively flat top surface, the aluminum nitride layer 150 may have no holes or tiny holes, and the aluminum nitride layer 150 has a defect density less than or equal to $5\times10^9/cm^2$ and high crystal quality. The aluminum nitride layer 150 having tiny holes means that the aluminum nitride layer 150 has a plurality of holes therein, and each hole is in a size less than 50 nm in at least one direction of a horizontal direction parallel to the substrate 110 and a vertical direction perpendicular to the substrate 110.

In the present embodiment, the aluminum nitride layer 150 formed after the step of FIG. 5 is disposed on the top surface 112 of the substrate 110, and a root mean square roughness of a top surface (i.e., the top surface 142 of the second aluminum nitride layer 140), with back to the substrate 110, of the aluminum nitride layer 150 is less than 3 nm. As a result, the composite substrate 100 including the substrate 110 and the aluminum nitride layer 150 is formed. An N-type semiconductor layer, a quantum well layer and a P-type semiconductor layer of a light-emitting diode can be formed on the composite substrate 100, which contributes to improving the crystallization quality of the N-type semiconductor layer, the quantum well layer and the P-type semiconductor layer.

In the present embodiment, when the second aluminum nitride layer 140 is formed on the first aluminum nitride layer 121, silicon may be doped in the second aluminum nitride layer 140 to regulate residual stress. In the present embodiment, a doping concentration of silicon in the second aluminum nitride layer 140 is more than $2 \times 10^{17}$ cm$^{-3}$ and less than $1 \times 10^{20}$ cm$^{-3}$. In a preferred embodiment, the doping concentration of silicon in the second aluminum nitride layer 140 is more than $2 \times 10^{18}$ cm$^{-3}$ and less than $5 \times 10^{19}$ cm$^{-3}$. In this embodiment, the in-plane lattice constant of the second aluminum nitride layer 140 is larger than the in-plane lattice constant of the first aluminum nitride layer 121 because of silicon doping in the second aluminum nitride layer 140. Besides, in this embodiment, a silicon concentration of the aluminum nitride layer 150 at a side adjacent to the substrate 110 (i.e. a bottom side in the figure) is lower than a silicon concentration of the aluminum nitride layer 150 at a side far away from the substrate 110 (i.e. a top side in the figure). In this embodiment, the distance between the highest silicon concentration position (e.g. the position at the bottom side of the second aluminum nitride layer 140) in the aluminum nitride layer to the top surface to the substrate 110 is higher than 600 nm in a vertical direction perpendicular to the substrate 110.

In the composite substrate 100 and the manufacturing method thereof of the present embodiment, since the plurality of nano-patterned recesses 114 separated from each other are used on the top surface 112 of the substrate 110, that is, a nano-patterned substrate having a recessed nano pattern is used to replace a traditional patterned substrate having a protruding nano pattern, thereby greatly reducing an intrinsic grain sewing difficulty of aluminum nitride epitaxy. In addition, in the present embodiment, the method for forming the nano-patterned recesses 114 may be the wet etching method, which contributes to improving the quality of epitaxy directly formed on aluminum nitride. Furthermore, by the method for forming the planarization layer 130 and then gradually removing the material of the planarization layer 130, the surface of the first aluminum nitride layer 121 is flattened, and by the annealing on the flattened first aluminum nitride layer 121, the crystal quality of the aluminum nitride layer 150 can be further improved, the sewing difficulty can be reduced, and a design space of the composite substrate 100 is expanded.

Figure 6A:
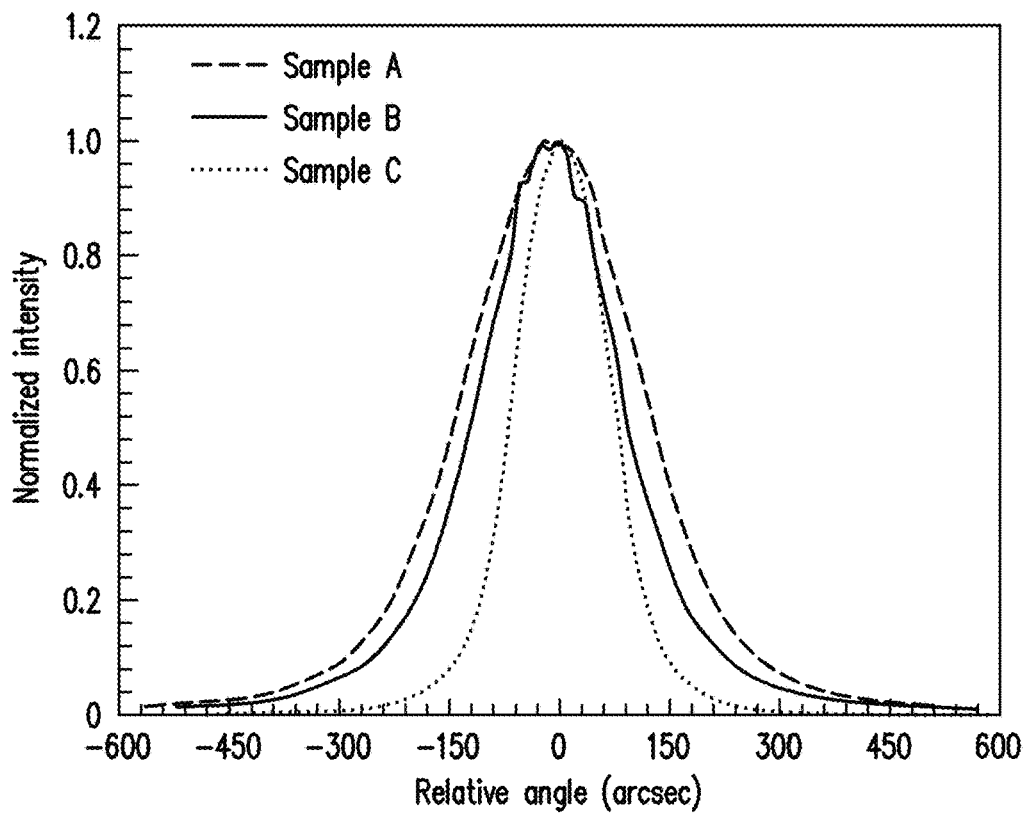
FIG. 6A is a (002) X-ray rocking curve of three different samples of the composite substrate of FIG. 5 after the growth of a second aluminum nitride layer.
Figure 6B:
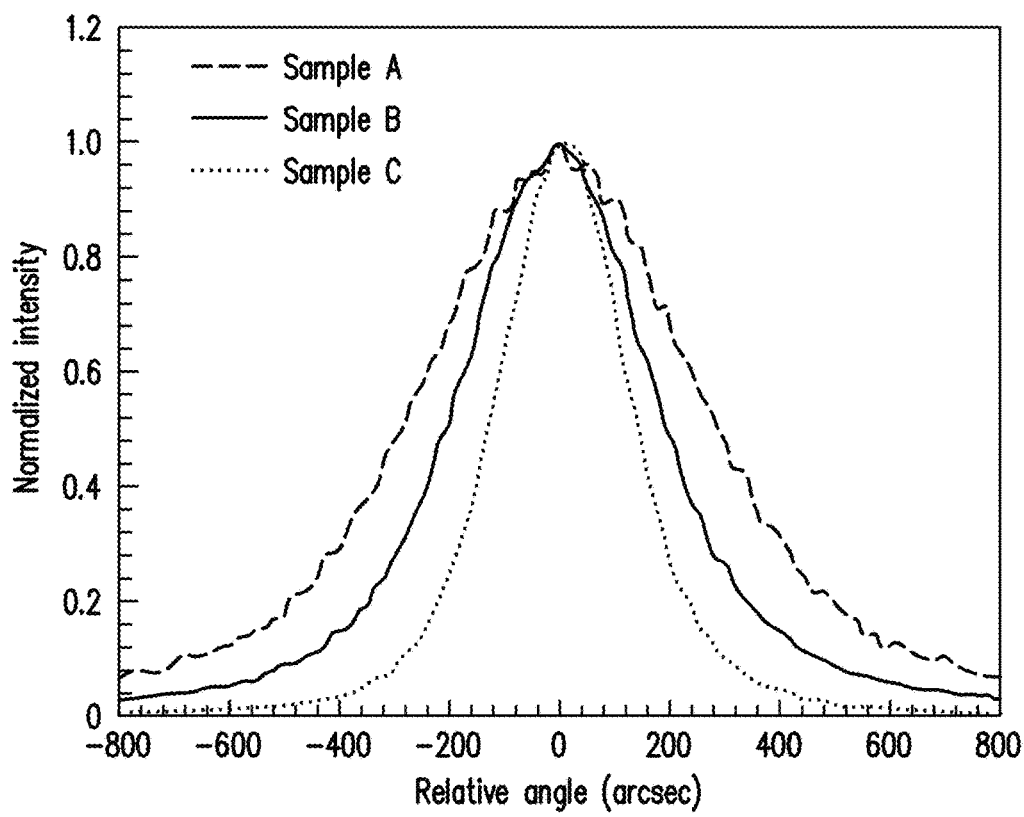
FIG. 6B is a (102) X-ray rocking curve of three different samples of the composite substrate of FIG. 5 after the growth of a second aluminum nitride layer.

FIG. 6A is a (002) X-ray rocking curve of three different samples of the composite substrate of FIG. 5 after the growth of the second aluminum nitride layer, and FIG. 6B is a (102) X-ray rocking curve of three different samples of the composite substrate of FIG. 5 after the growth of the second aluminum nitride layer. A sample A, a sample B and a sample C are used here to verify the crystal quality of the present embodiment in FIGS. 4, 5, 6A and 6B. The sample A is a sample that the first aluminum nitride layer 121 is formed on the substrate 110 but is not annealed, and has a film thickness T3 of 300 nm. The sample B is a sample that the first aluminum nitride layer 121 is formed on the substrate 110 and annealed, and has a film thickness T3 of 300 nm. The sample C is a sample that the first aluminum nitride layer 121 is formed on the substrate 110 and annealed, and has a film thickness T3 of 600 nm. When the second aluminum nitride layer 140 is not formed on the sample A, the sample B and the sample C, the FWHMs (full width at half maximum) of the (002) X-ray rocking curve are 50 arcsec, 30 arcsec and 70 arcsec, respectively, and the FWHMs of the (102) X-ray rocking curve are more than 2000 arcsec, 392 arcsec and 371 arcsec, respectively. The (002) X-ray rocking curve and the (102) X-ray rocking curve after the second aluminum nitride layer 140 is formed on the sample A, the sample B and the sample C are respectively as shown in FIGS. 6A and 6B. After the second aluminum nitride layer 140 is formed on the sample A, the sample B and the sample C, the FWHMs of the (002) X-ray rocking curve are 420 arcsec, 216 arcsec and 144 arcsec, respectively, and the FWHMs of the (102) X-ray rocking curve are 560 arcsec, 400 arcsec and 280 arcsec, respectively. In the present embodiment, the FWHM of the (002) X-ray rocking curve of the aluminum nitride layer 150 is less than or equal to 216 arc arcsec (e.g., less than 150 arcsec), and the FWHM of the (102) X-ray rocking curve of the aluminum nitride layer 150 is less than or equal to 400 arcsec (e.g., less than 350 arcsec). The above experimental data may verify that the annealing can effectively improve the crystal quality of the first aluminum nitride layer 121 before the growth of the second aluminum nitride layer 140, and an enough thickness of the first aluminum nitride layer 121 contributes to further improving the crystal quality of the second aluminum nitride layer 140. In the present embodiment, finally, the FWHM of the (102) X-ray rocking curve of the aluminum nitride layer 150 of the composite substrate 100 may be 260 arcsec, and the dislocation density is calculated to be about $4 \times 10^8$ cm$^{-2}$.

Figure 7:
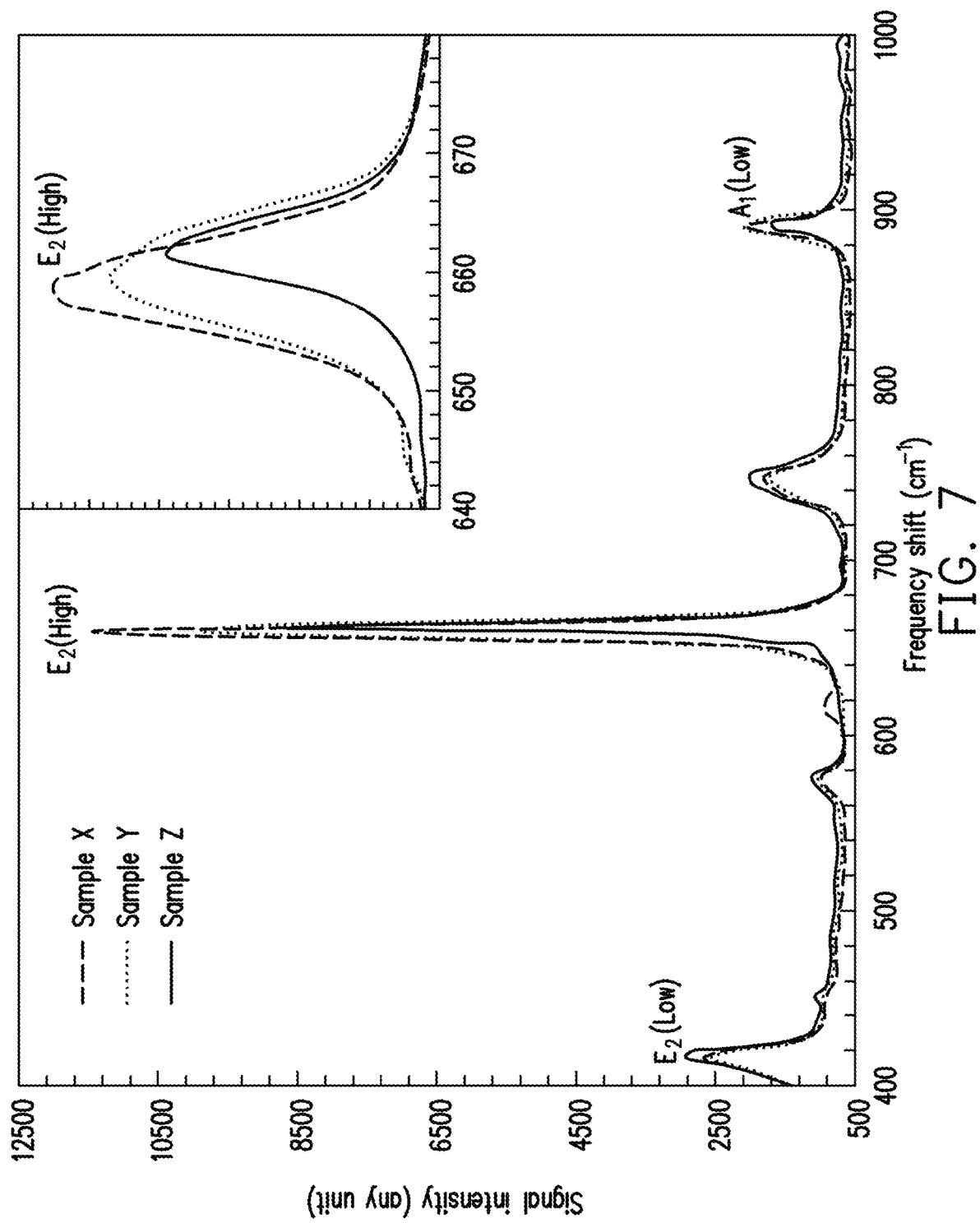
FIG. 7 is a Raman spectrogram of three different samples of a composite substrate after the growth of a second aluminum nitride layer.

FIG. 7 is a Raman spectrogram of three different samples after the growth of the second aluminum nitride layer 140. A sample X in FIG. 7 is that the first aluminum nitride layer 121 is formed on the substrate 110, but the first aluminum nitride layer 121 is not annealed, and the second aluminum nitride layer 140 without silicon is grown on the first aluminum nitride layer 121. A sample Y is that the first aluminum nitride layer 121 is formed on the substrate 110 and annealed, and the second aluminum nitride layer 140 without silicon is grown on the first aluminum nitride layer 121. A sample Z is that the first aluminum nitride layer 121 is formed on the substrate 110 and annealed, and the second aluminum nitride layer 140 with silicon is grown on the first aluminum nitride layer 121. The aluminum nitride layer 150 of the samples X, Y and Z in FIG. 7 are 2.11 µm, 2.12 µm and 2.13 µm in thickness, respectively, and the samples X, Y and Z in FIG. 7 have warpages of 20.3 µm, 60.8 µm and 46.4 µm, respectively, and E2 high modes of Raman spectrums of the samples X, Y and Z in FIG. 7 have frequency shifts of 658.9 cm$^{-1}$, 661.7 cm$^{-1}$ and 659.6 cm$^{-1}$, respectively. In this embodiment, the frequency shift of the E2 high mode of Raman spectrum of the composite substrate 100 is less than or equal to 659.6 cm$^{-1}$. From the frequency shifts of the Raman spectrums, the values of the stress of the samples X, Y and Z in FIG. 7 can be correspondingly found according to documents to be −1 GPa, −1.96 GPa and −1.24 GPa, respectively, and the values of the stress of the samples X, Y and Z in FIG. 7 can be calculated according to the warpages as −0.54 GPa, −1.61 GPa and −1.22 GPa, respectively, by means of a Stoney equation. The negative value of the stress means the stress is compressive to distinguish from the tensile stress which has a positive value. The more the absolute value of the negative value of the stress is, the larger the compressive stress is. In this embodiment, the value of the residual stress of the composite substrate 100 is larger than or equal −1.24 GPa.

Figure 8:
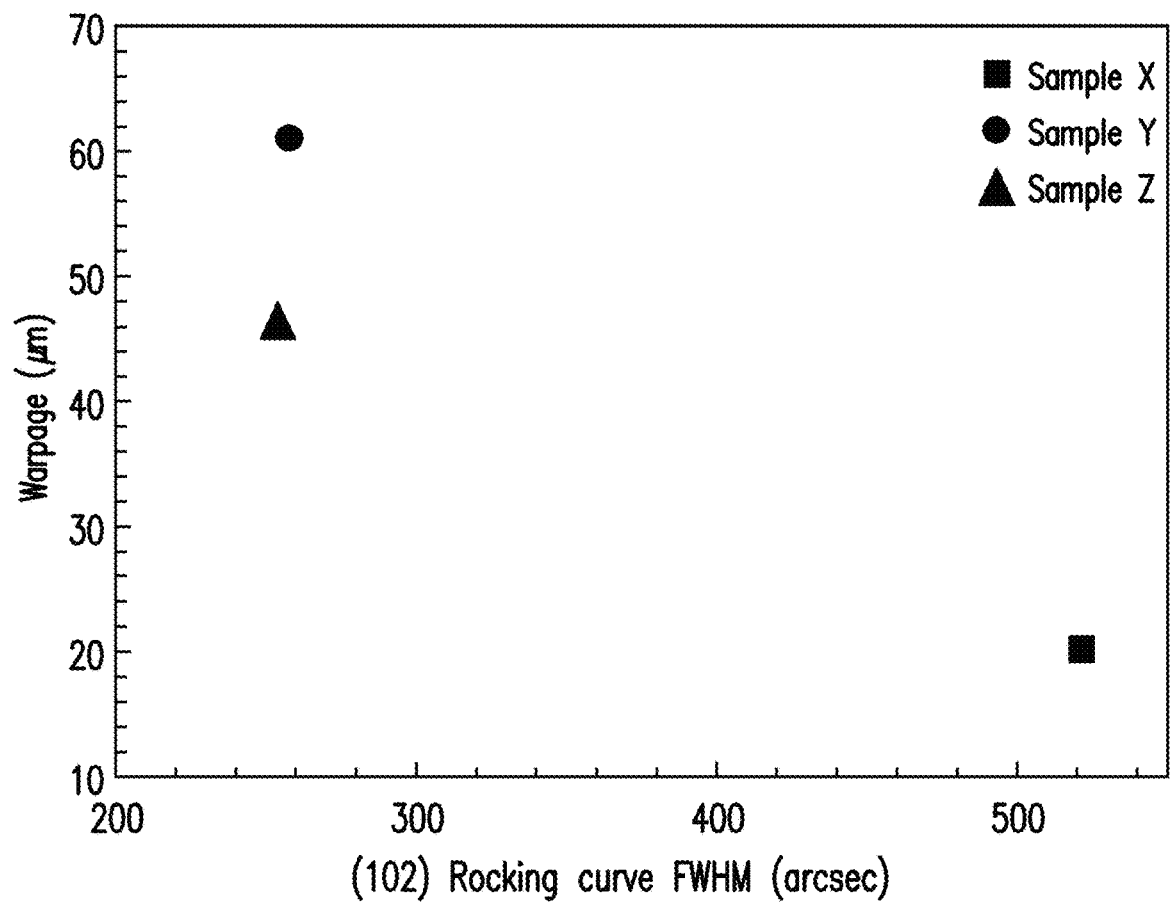
FIG. 8 is a diagram of (102) X-ray rocking curve FWHM (full width at half maximum) vs. warpage of three different samples of the composite substrate of FIG. 7 after the growth of a second aluminum nitride layer.

FIG. 8 is a diagram of (102) X-ray rocking curve FWHM vs. warpage of three different samples X, Y and Z of the composite substrate of FIG. 7 after the growth of the second aluminum nitride layer 140. The warpages of the samples X, Y, and Z in FIG. 8 are 20.3 μm, 60.8 μm, and 46.4 μm, respectively. After the second aluminum nitride layer 140 is formed on the sample X, the sample Y and the sample Z, the FWHMs of the (102) X-ray rocking curve are 521 arcsec, 259 arcsec, and 254 arcsec, respectively. It can be seen from the above experimental data that the high-temperature annealing effectively improves the crystal quality, but a residual thermal compression strain causes a large wafer warpage after the growth of the second aluminum nitride layer 140, and the method for doping the silicon into the second aluminum nitride layer 140 can balance this strain and maintain high crystal quality.

Figure 9:
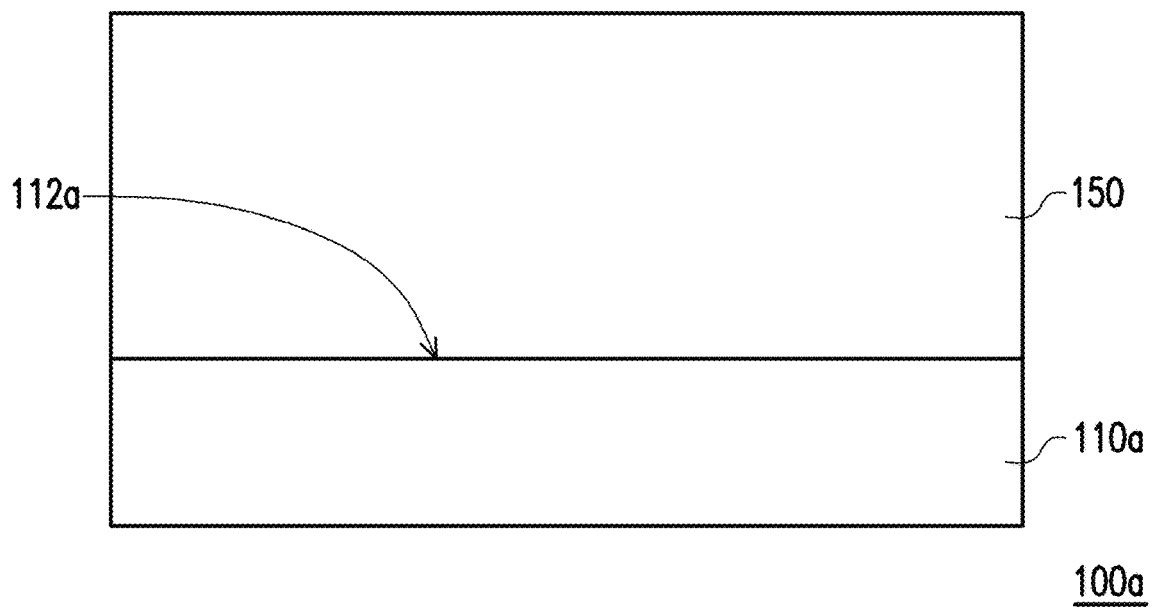
FIG. 9 is a cross-sectional diagram of a composite substrate according to another embodiment of the disclosure.

FIG. 9 is a cross-sectional diagram of a composite substrate according to another embodiment of the disclosure. Referring to FIG. 9, the composite substrate 100a of the present embodiment is similar to the composite substrate 100 of FIG. 5, but main differences between the two are as follows. A top surface 112a of the substrate 110a of the composite substrate 100a of the present embodiment is a flat surface without the nano-patterned recesses 114 of FIG. 5. In addition, the manufacturing method of the composite substrate 100a of the present embodiment is to form the aluminum nitride layer 150 directly on the top surface 112a of the substrate 110a, and the aluminum nitride layer 150 is doped with silicon to effectively regulate the residual stress. The material of the substrate 110a of the present embodiment is the same as that of the substrate 110 of FIG. 5, and the method for forming the aluminum nitride layer 150 of the present embodiment may be the MOCVD.

Figure 10:
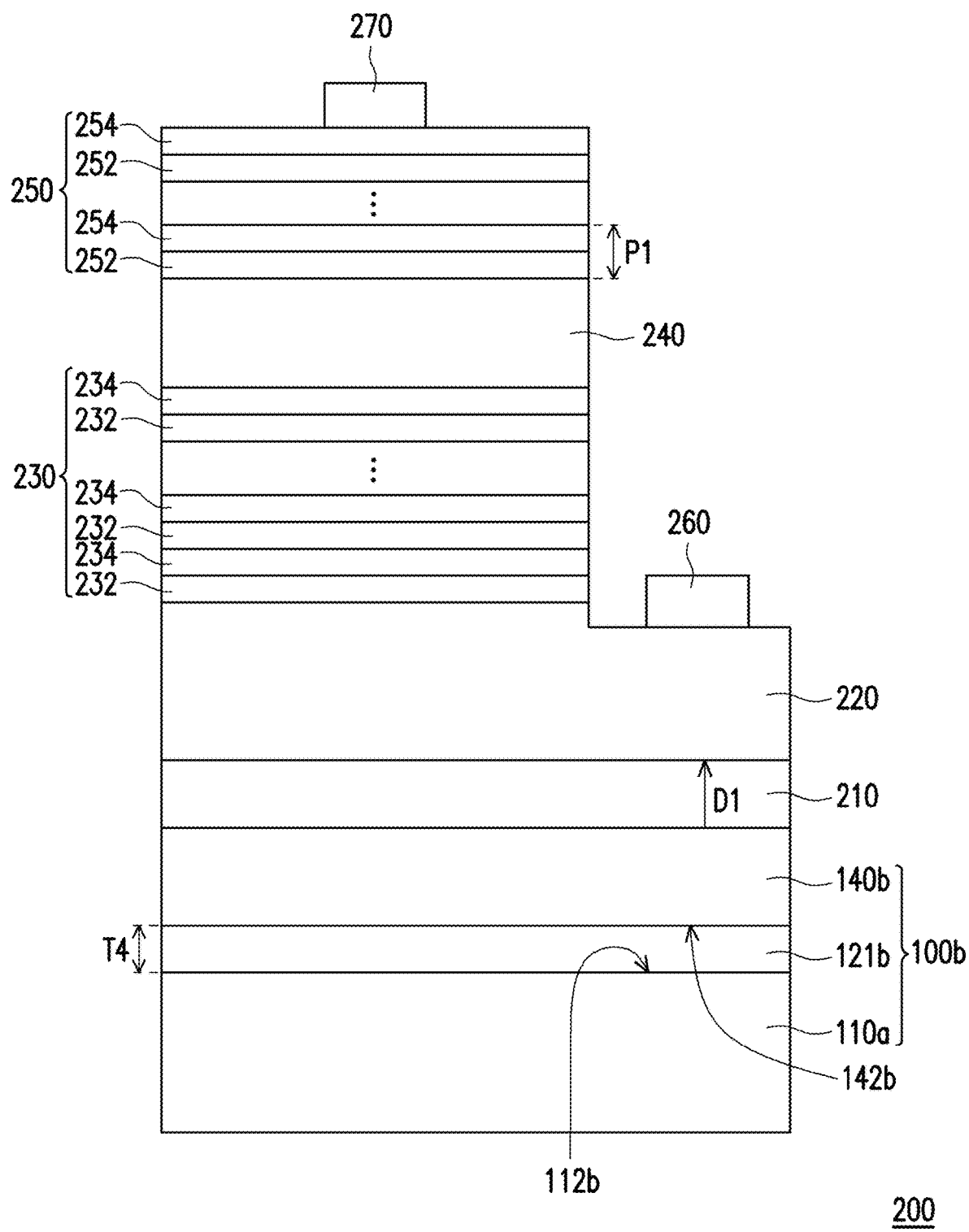
FIG. 10 is a schematic cross-sectional view of a light-emitting diode according to an embodiment of the disclosure.

FIG. 10 is a schematic cross-sectional view of a light-emitting diode according to an embodiment of the disclosure. Referring to FIG. 10, a light-emitting diode (LED) 200 in this embodiment includes a substrate 110a, a buffer layer 121b, a strain release layer 140b, an n-type semiconductor layer 220, a light-emitting layer 230, a p-type semiconductor layer 240, and an electrode contacting layer 250. The substrate 110a, the buffer layer 121b, and the strain release layer 140b form a composite substrate 100b. The composite substrate 100b in this embodiment is similar to the composite substrate 100a in FIG. 9, and the main difference therebetween is as follows. The buffer layer 121b is disposed on the substrate 110a, and the strain release layer 140b is disposed on the buffer layer 121b, wherein the buffer layer 121b is between the substrate 110a and the strain release layer 140b. The material of the buffer layer 121b is the same as the material of the aforementioned first aluminum nitride layer 121, and is also an annealed layer as the aforementioned first aluminum nitride layer 121 is. In this embodiment, a full width at half maximum (FWHM) of a (102) X-ray rocking curve of the buffer layer 121b is less than 350 arcsec, and a threading dislocation density of the buffer layer is less than $2 \times 10^9$ cm$^{-2}$, which means the buffer layer 121b has good epitaxial quality.

The material of the strain release layer 140b includes $Al_{1-x}Ga_xN$, where $0 \leq x < 0.15$. For example, the strain release layer 140b is an $Al_{1-x}Ga_xN$ layer, and when x is equal to zero, the strain release layer 140b is an aluminum nitride layer.

The strain release layer 140b is doped with silicon to release a compressive strain due to the buffer layer 121b. The concentration of silicon doped in the strain release layer 140b is greater than $10^{19}$ cm$^{-3}$. Since the buffer layer 121b is annealed and is thus compressive, an aluminum nitride layer without silicon dopant has a strong compressive strain when formed on the buffer layer 121b. Although the aluminum nitride layer without silicon dopant may have good epitaxial quality, the aforementioned compressive strain plus another compressive strain due to the lattice constant mismatch between the aluminum nitride layer and the AlGaN layer (i.e. an n-type semiconductor layer) may cause the strain of the AlGaN layer to be hard to manage, which reduces the epitaxial quality of the AlGaN layer and the layers thereabove. In this embodiment, the strain release layer 140b is doped with high concentration silicon, and silicon will generate a lot of vacancies and gradually release the compressive strain in the crystal. Therefore, the strain release layer 140b can have a small defect density and good epitaxial quality, and the good epitaxial quality may be inherited by the layers above the strain release layer 140b. In this embodiment, a defect density of the strain release layer 140b is less than or equal to $5 \times 10^9$/cm$^2$. Besides, in this embodiment, a distance T4 between a bottom surface 142b of the strain release layer 140b and a top surface 112b of the substrate 110a is less than 600 nm, and the bottom surface 142b of the strain release layer 140b and the top surface 112b of the substrate 110a face each other.

The n-type semiconductor layer 220 is disposed on the strain release layer 140b. A material of the n-type semiconductor layer 220 includes $Al_{1-z}Ga_zN$, where $z > x + 0.15$. The light-emitting layer 230 is disposed on the n-type semiconductor layer 220. The p-type semiconductor layer 240 is disposed on the light-emitting layer 230. The electrode contacting layer 250 is disposed on the p-type semiconductor layer 240. In this embodiment, since the strain release layer 140b has a small defect density, good epitaxy quality, and less compressive strain, thus the n-type semiconductor layer 220, the light-emitting layer 230, and the p-type semiconductor layer 240 can have better epitaxial quality.

In this embodiment, the LED 200 further includes an aluminum grading layer 210 disposed between the strain release layer 140b and the n-type semiconductor layer 220, wherein a material of the aluminum grading layer 210 includes $Al_{1-y}Ga_yN$, where $x \leq y \leq z$. In this embodiment, the aluminum grading layer 210 is an aluminum gallium nitride layer. The aluminum concentration of the aluminum grading layer 210 grades from a concentration close to an aluminum concentration of the strain release layer 140b to a concentration close to an aluminum concentration of the n-type semiconductor layer 220 along a direction D1 from the strain release layer 140b to the n-type semiconductor layer 220.

In this embodiment, the electrode contacting layer 250 has a superlattice structure including a plurality of $Al_{1-w}Ga_wN$ layers 252 and a plurality of $Al_{1-v}Ga_vN$ layers 254 stacked alternately, where w is not equal to v. The period P1 of the superlattice structure may be less than 4 nm. The superlattice structure can reduce the absorbance of the electrode contacting layer 250 for light emitted by the light-emitting layer 230, so as to enhance the light extraction efficiency of the LED 200. In this embodiment, the absorbance of the electrode contacting layer 250 for light emitted by the light-emitting layer 230 is less than 10%. However, in other embodiments, the electrode contacting layer 250 may be a single AlGaN layer with no superlattice structure.

In this embodiment, the light-emitting layer 230 may be a multiple quantum well layer having a plurality of barrier layers 232 and a plurality of well layers 234 stacked alternately. The barrier layers 232 and the well layers 234 may be aluminum gallium nitride layer, wherein the molar fraction of aluminum of the barrier layers 232 is different from the molar fraction of aluminum of the well layers 234. The aluminum concentration in the well layers 234 is lower than the aluminum concentration in the barrier layers 232.

In addition, an electrode 260 and an electrode 270 may be disposed on the n-type semiconductor layer 220 and the electrode contacting layer 250, respectively. By applying a forward voltage between the electrode 270 and the electrode 260, the light emitting layer 230 may emit light, for example, ultraviolet C (UVC). In other embodiments, the light emitting layer 230 may emit light, for example, ultraviolet B (UVB). In this embodiment, the electrode 260 and the electrode 270 may be metal electrodes.

Figure 11:
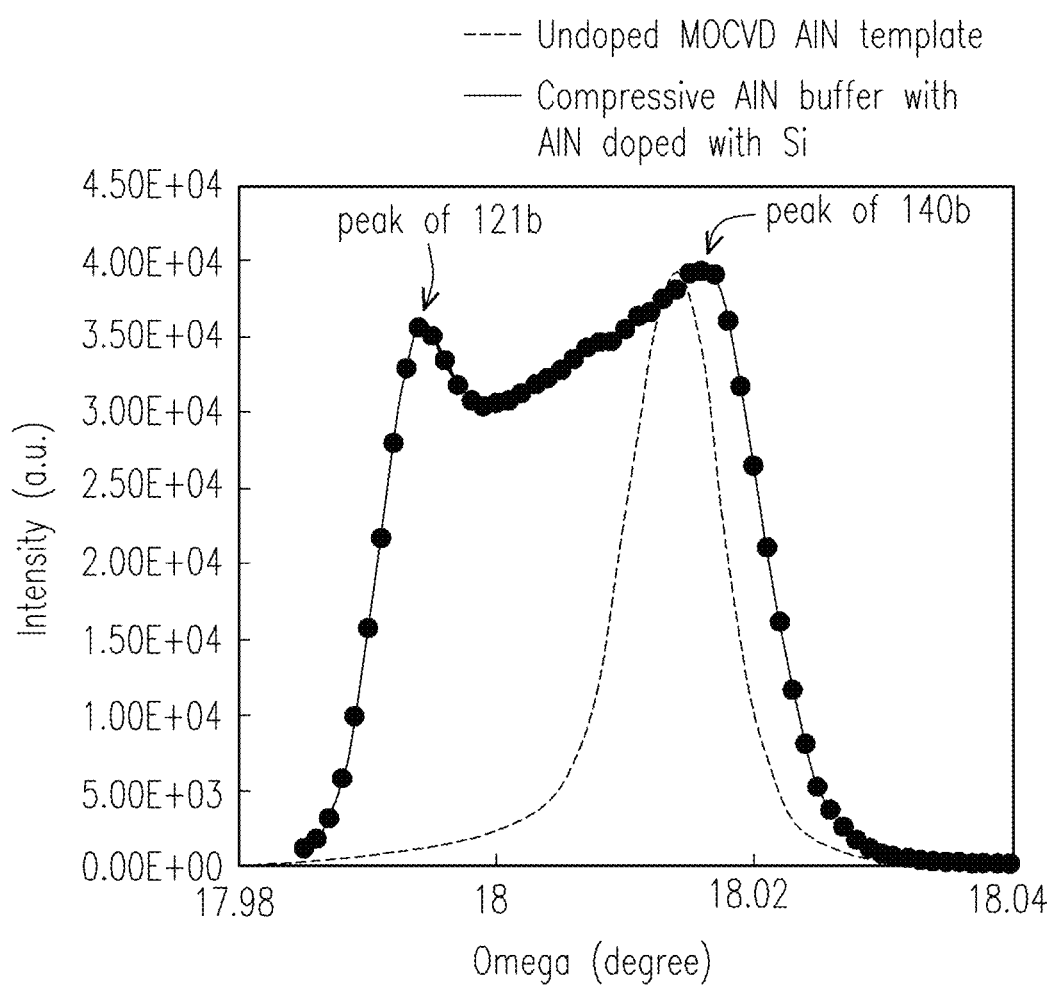
FIG. 11 shows an X-ray ω-2θ scan of an aluminum nitride layer without silicon dopant and an X-ray ω-2θ scan of the buffer layer and the strain release layer in FIG. 10.

FIG. 11 shows an X-ray ω-2θ scan of an aluminum nitride layer without silicon dopant (indicated by "Undoped MOCVD AlN template") and an X-ray ω-2θ scan of the buffer layer and the strain release layer in FIG. 10 (indicated by "Compressive AlN buffer with AlN doped with Si"). The unit "a.u." in FIG. 11 means "arbitrary unit". Referring to FIG. 10 and FIG. 11, it can be learned from FIG. 11 that when silicon is doped into the strain release layer 140b, a peak of the X-ray ω-2θ scan of an aluminum nitride layer including the buffer layer 121b and the strain release layer 140b is widened or split into two peaks (i.e. the peak of 121b and the peak of 140b shown in FIG. 11), which means the strain in the strain release layer 140b is released.

Figure 12:
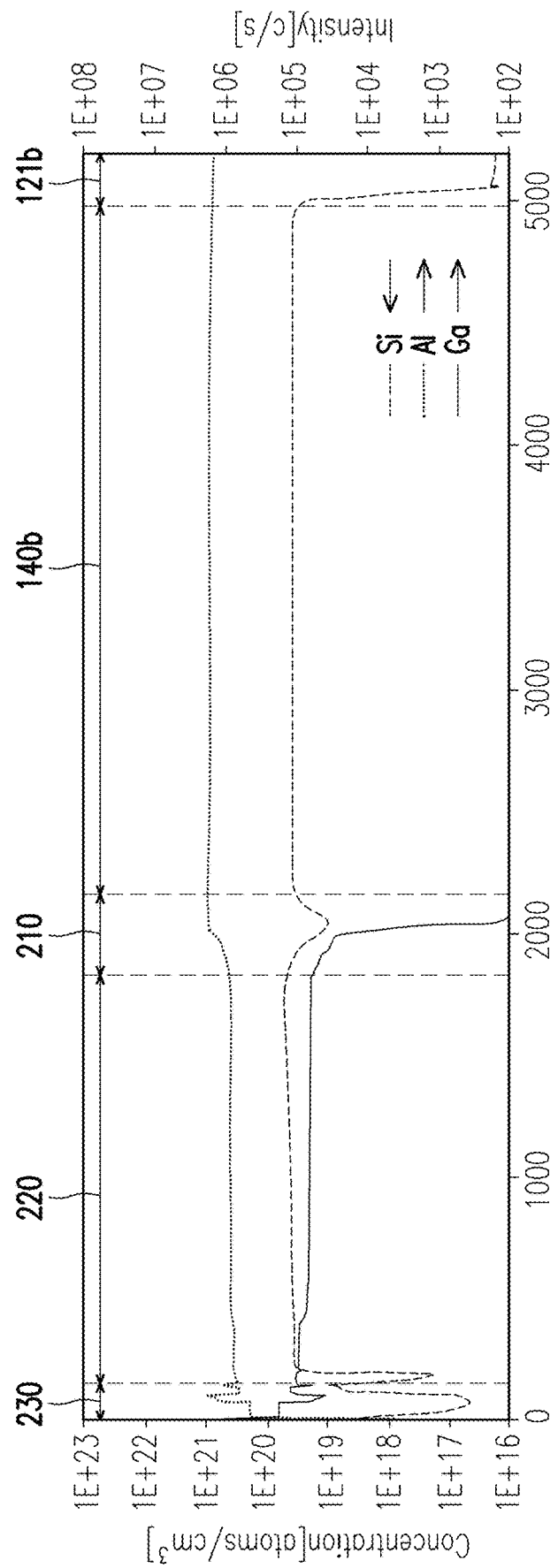
FIG. 12 is a diagram showing the ingredient distribution of the light-emitting diode of FIG. 10 measured by a secondary ion mass spectrometer.

FIG. 12 is a diagram showing the ingredient distribution of the light-emitting diode of FIG. 10 measured by a secondary ion mass spectrometer (SIMS). In FIG. 12, the unit "c/s" means counts per second. Referring to FIG. 10 and FIG. 12, it can be learned from FIG. 12 that the concentration of silicon doped in the strain release layer 140b is greater than $10^{19}$ cm$^{-3}$, and the aluminum concentration of the aluminum grading layer 210 grades from a concentration close to an aluminum concentration of the strain release layer 140b to a concentration close to an aluminum concentration of the n-type semiconductor layer 220.

Figure 13:
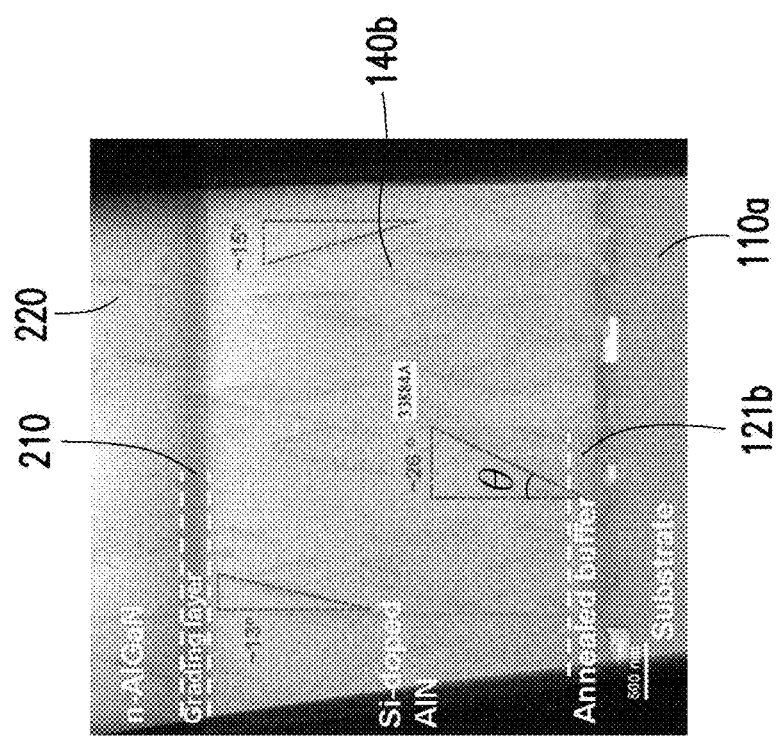
FIG. 13 is an image of scanning transmission electron microscopy (STEM) of a lower part of the light-emitting diode in FIG. 10.
Figure 14:
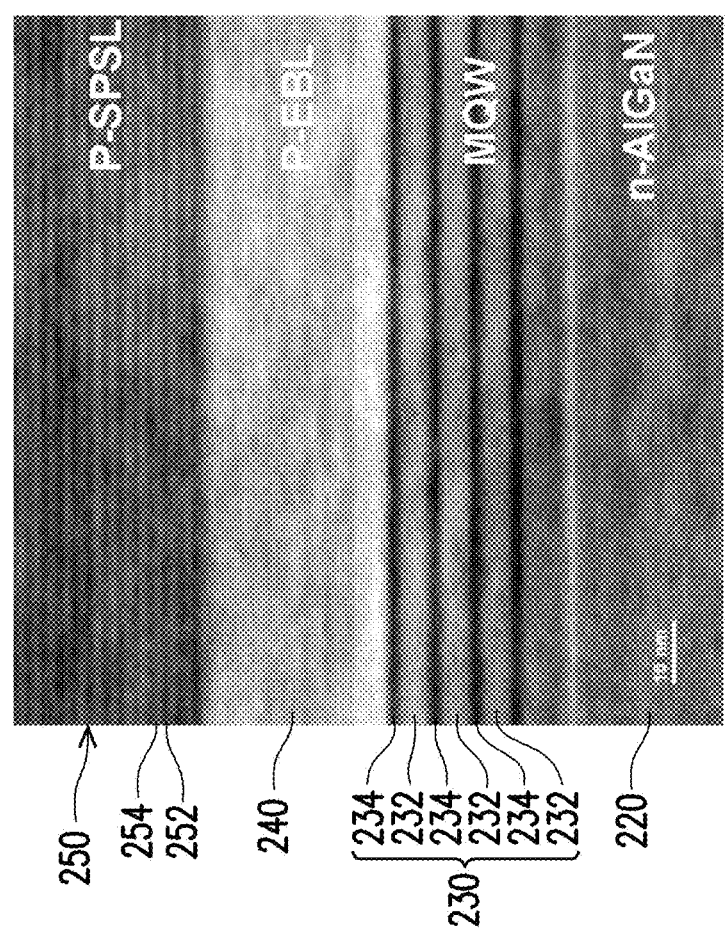
FIG. 14 is an image of scanning transmission electron microscopy (STEM) of an upper part of the light-emitting diode in FIG. 10.

FIG. 13 is an image of scanning transmission electron microscopy (STEM) of a lower part of the light-emitting diode in FIG. 10. FIG. 14 is an image of scanning transmission electron microscopy (STEM) of an upper part of the light-emitting diode in FIG. 10. Referring to FIG. 10 and FIG. 13, in this embodiment, the dislocation 143b within the strain release layer 140b is inclined with respect to a normal of the substrate by an inclined angle θ, and the inclined angle θ ranges from 10 degrees to 30 degrees. FIG. 13 shows three kinds of the inclined angle θ being about 13 degrees, 26 degrees, and 15 degrees, respectively, for example. If the strain release layer 140b is replaced by an aluminum nitride layer without silicon dopant, the dislocations in this layer will be irregular and curved. In comparison therewith, the strain release layer 140b has a more regular inclined dislocations, which means the strain release layer 140b has better epitaxial quality. It can be learned from FIG. 14 that the layers above the strain release layer 140b also have good epitaxial quality.

Figure 15:
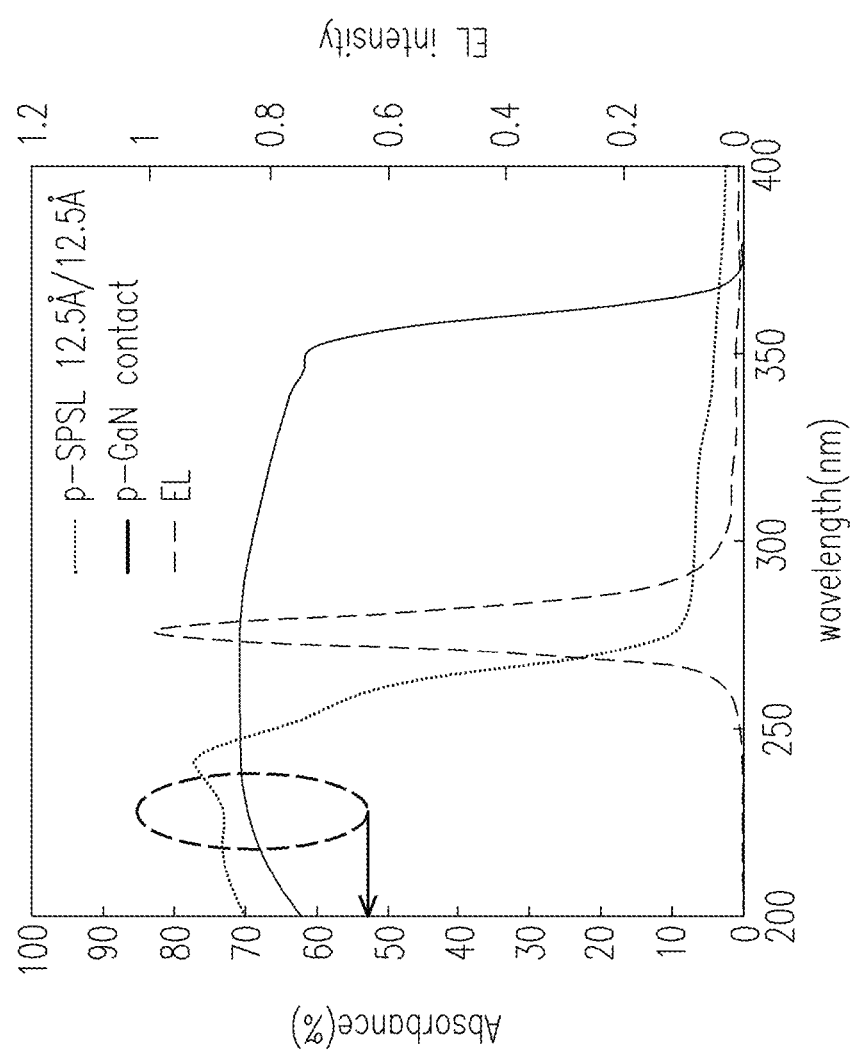
FIG. 15 shows absorbance spectra of two kinds of the electrode contacting layer and an electroluminescence (EL) spectrum of the light-emitting layer in FIG. 10.

FIG. 15 shows absorbance spectra of two kinds of the electrode contacting layer and an electroluminescence (EL) spectrum of the light-emitting layer in FIG. 10. The curve indicated by "p-SPSL 12.5 Å/12.5 Å" is an absorbance spectrum curve of the electrode contacting layer 250 in FIG. 10, wherein each of the $Al_{1-w}Ga_wN$ layers 252 has a thickness of 12.5 angstroms, and each of the $Al_{1-v}Ga_vN$ layers 254 has a thickness of 12.5 angstroms. Moreover, the $Al_{1-w}Ga_wN$ layers 252 (the dark lines in FIG. 14) may have w being 0.6, and the $Al_{1-v}Ga_vN$ layers 254 (bright lines in FIG. 14) may have v being 0.36, for example. The curve indicated by "p-GaN contact" is an absorbance spectrum curve of the electrode contacting layer being a single p-type gallium nitride layer with no superlattice structure. The curve indicated by "EL" is an EL spectrum of the light-emitting layer 230. By comparing the three curves, it can be learned that the electrode contacting layer 250 in FIG. 10 having superlattice structure absorbs less light from the light-emitting layer 230, so that the LED 200 has better light extraction efficiency.

Figure 16:
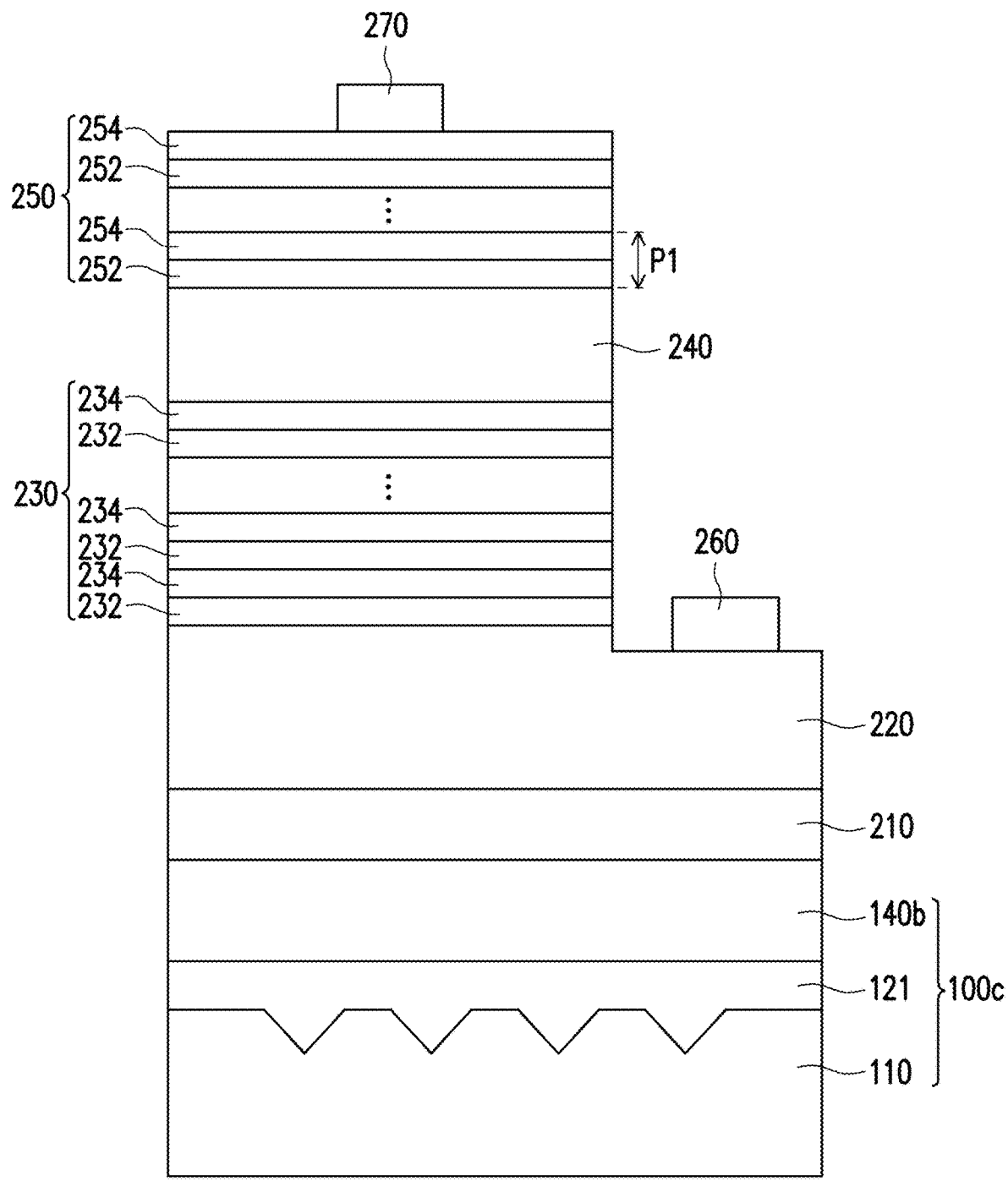
FIG. 16 is a schematic cross-sectional view of a light-emitting diode according to another embodiment of the disclosure.

FIG. 16 is a schematic cross-sectional view of a light-emitting diode according to another embodiment of the disclosure. Referring to FIG. 16, the LED 200c in this embodiment is similar to the LED 200 in FIG. 10, and the main difference therebetween is that the composite substrate 100c adopts the substrate 110 having a plurality of nano-patterned recesses as shown in FIG. 1A (i.e. a nano-patterned sapphire substrate), and the buffer layer formed on the substrate 110 is the first aluminum nitride layer 121 in FIG. 5. The manufacturing method of the first aluminum nitride layer 121 has been described in the aforementioned embodiment and will not be repeated herein.

In this embodiment, the strain release layer 140b has no observable hole, which means the holes in strain release layer have a size less than 50 nm in at least one direction of a horizontal direction parallel to the substrate 110 and a vertical direction perpendicular to the substrate 110, wherein the hole may be due to the nano-patterned recesses of the substrate 110.

Figure 17:
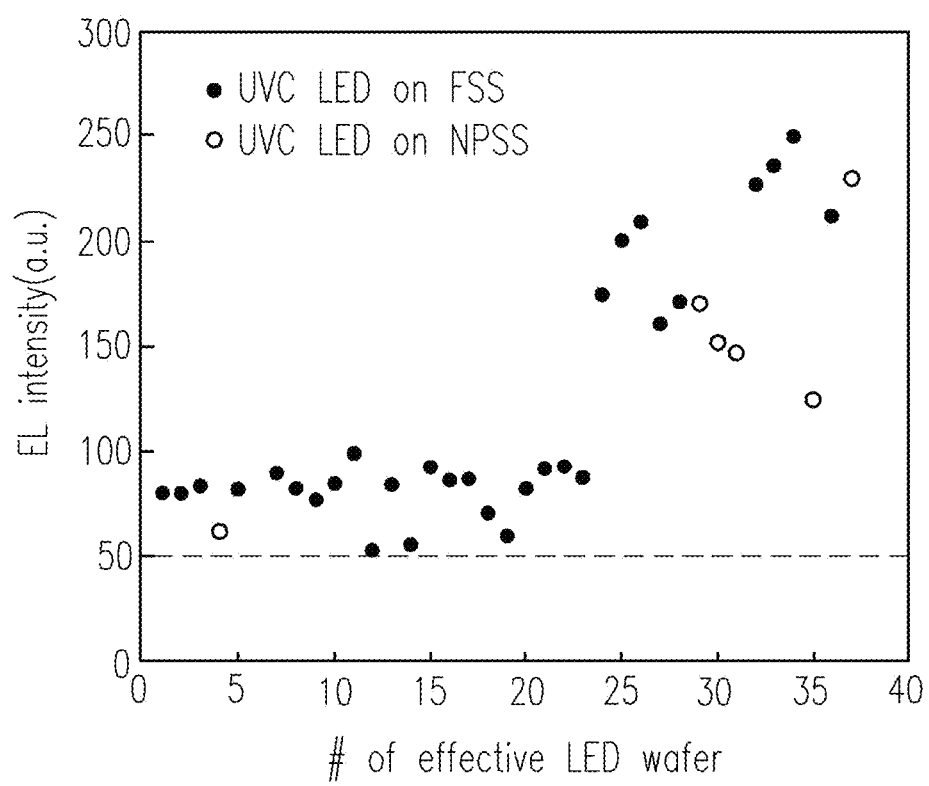
FIG. 17 shows the electroluminescence (EL) intensity of a plurality of LEDs of FIG. 10 and FIG. 16.

FIG. 17 shows the electroluminescence (EL) intensity of a plurality of LEDs of FIG. 10 and FIG. 16. Referring to FIG. 17, the data point denoted by "UVC LED on FSS" means the EL intensity of the LED 200 of FIG. 10, and the data point denoted by "UVC LED on NPSS" means the EL intensity of the LED 200c in FIG. 16. The abscissa of FIG. 17 means the test serial number of different LED wafers which may effectively emit light. Number 23 or less is the LED not adopting the strain release layer 140b and the electrode contacting layer 250 having superlattice structure, and Number 24 or more is the LED 200 or 200c adopting the strain release layer 140b and the electrode contacting layer 250 having superlattice structure. It can be learned from FIG. 17 that, by adopting the strain release layer 140b and the electrode contacting layer 250 having superlattice structure, the EL intensity of the LED 200 is increased by at least about 50%.

Based on the above, in the composite substrate and the manufacturing method thereof of the embodiments of the disclosure, since the plurality of nano-patterned recesses separated from each other are used on the top surface of the substrate, that is, a nano-patterned substrate having a recessed nano pattern is used to replace the traditional patterned substrate having the protruding nano pattern, thereby greatly reducing the intrinsic grain sewing difficulty of aluminum nitride epitaxy. In addition, in the present embodiment of the disclosure, the method for forming the nano-patterned recesses may be the wet etching method, which contributes to improving the quality of epitaxy directly formed on aluminum nitride. Furthermore, in the embodiments of the disclosure, by the method for forming the planarization layer and then gradually removing the material of the planarization layer, the surface of the first aluminum nitride layer is flattened, and by the annealing on the flattened first aluminum nitride layer, the crystal quality of the aluminum nitride layer can be further improved, the sewing difficulty can be reduced, and the design space of the composite substrate is expanded. In the composite substrate and the LED according to the embodiments of the disclosure, the strain release layer is adopted and doped with high concentration silicon, and silicon will generate a lot of vacancies and gradually release the compressive strain in the crystal. Therefore, the strain release layer can have a small defect density and good epitaxial quality, and the good epitaxial quality may be inherited by the layers above the strain release layer.

Although the disclosure is described with reference to the above embodiments, the embodiments are not intended to limit the disclosure. A person of ordinary skill in the art may make variations and modifications without departing from the spirit and scope of the disclosure. Therefore, the protection scope of the disclosure should be subject to the appended claims.

What is claimed is:

1. A composite substrate comprising:
a substrate;
a buffer layer disposed on the substrate; and
a strain release layer disposed on the buffer layer, wherein the buffer layer is between the substrate and the strain release layer, a material of the strain release layer comprises $Al_{1-x}Ga_xN$, where $0 \leq x < 0.15$, the strain release layer is doped with silicon to release a compressive strain due to the buffer layer, a concentration of silicon doped in the strain release layer is greater than $10^{19}$ cm$^{-3}$, and a surface defect density of the strain release layer is less than or equal to $5 \times 10^9$/cm$^2$.

2. The composite substrate according to claim 1, wherein the buffer layer is an aluminum nitride layer.

3. The composite substrate according to claim 1, wherein a full width at half maximum (FWHM) of a (102) X-ray rocking curve of the buffer layer is less than 350 arcsec.

4. The composite substrate according to claim 1, wherein a distance between a bottom surface of the strain release layer and a top surface of the substrate is less than 600 nm, and the bottom surface of the strain release layer and the top surface of the substrate face each other.

5. The composite substrate according to claim 1, wherein a dislocation within the strain release layer is inclined with respect to a normal of the substrate by an inclined angle, and the inclined angle ranges from 10 degrees to 30 degrees.

6. The composite substrate according to claim 1, wherein the strain release layer has no observable hole.

7. The composite substrate according to claim 1, wherein the buffer layer is an annealed layer.

8. The composite substrate according to claim 1, wherein a threading dislocation density of the buffer layer is less than $2 \times 10^9$ cm$^{-2}$.

9. A light-emitting diode (LED) comprising:
a substrate;
a buffer layer disposed on the substrate;
a strain release layer disposed on the buffer layer, wherein the buffer layer is between the substrate and the strain release layer, a material of the strain release layer comprises $Al_{1-x}Ga_xN$, where $0 \leq x < 0.15$, the strain release layer is doped with silicon to release a compressive strain due to the buffer layer, a concentration of silicon doped in the strain release layer is greater than $10^{19}$ cm$^{-3}$, and a surface defect density of the strain release layer is less than or equal to $5 \times 10^9$/cm$^2$;
an n-type semiconductor layer disposed on the strain release layer, a material of the n-type semiconductor layer comprising $Al_{1-z}Ga_zN$, where $z > x + 0.15$;
a light-emitting layer disposed on the n-type semiconductor layer;
a p-type semiconductor layer disposed on the light-emitting layer; and
an electrode contacting layer disposed on the p-type semiconductor layer.

10. The LED according to claim 9, wherein the buffer layer is an aluminum nitride layer.

11. The LED according to claim 9, wherein a full width at half maximum (FWHM) of a (102) X-ray rocking curve of the buffer layer is less than 350 arcsec.

12. The LED according to claim 9, wherein a distance between a bottom surface of the strain release layer and a top surface of the substrate is less than 600 nm, and the bottom surface of the strain release layer and the top surface of the substrate face each other.

13. The LED according to claim 9, wherein a dislocation within the strain release layer is inclined with respect to a normal of the substrate by an inclined angle, and the inclined angle ranges from 10 degrees to 30 degrees.

14. The LED according to claim 9, wherein the strain release layer has no observable hole.

15. The LED according to claim 9, wherein the buffer layer is an annealed layer.

16. The LED according to claim 9, wherein a threading dislocation density of the buffer layer is less than $2 \times 10^9$ cm$^{-2}$.

17. The LED according to claim 9 further comprising an aluminum grading layer disposed between the strain release layer and the n-type semiconductor layer, wherein a material of the aluminum grading layer comprises $Al_{1-y}Ga_yN$, where $x \leq y \leq z$, an aluminum concentration of the aluminum grading layer grades from a concentration close to an aluminum concentration of the strain release layer to a concentration close to an aluminum concentration of the n-type semiconductor layer along a direction from the strain release layer to the n-type semiconductor layer.

18. The LED according to claim 9, wherein the electrode contacting layer has a superlattice structure comprising a plurality of $Al_{1-w}Ga_wN$ layers and a plurality of $Al_{1-v}Ga_vN$ layers stacked alternately, where w is not equal to v.

19. The LED according to claim 18, wherein a period of the superlattice structure is less than 4 nm.

20. The LED according to claim 18, wherein an absorbance of the electrode contacting layer for light emitted by the light-emitting layer is less than 10%.

* * * * *